United States Patent [19]
Liang et al.

[11] Patent Number: 6,051,458
[45] Date of Patent: Apr. 18, 2000

[54] DRAIN AND SOURCE ENGINEERING FOR ESD-PROTECTION TRANSISTORS

[75] Inventors: Mong-Song Liang, Hsin-Chu; Shyh-Chyi Wong, Taichung, both of Taiwan

[73] Assignee: Taiwan Semiconductor Manufacturing Company, Hsin-Chu, Taiwan

[21] Appl. No.: 09/072,254

[22] Filed: May 4, 1998

[51] Int. Cl.[7] .................................................. H01L 21/8238
[52] U.S. Cl. ........................ 438/224; 438/231; 438/286; 438/919
[58] Field of Search .................................... 438/200, 217, 438/220, 223, 224, 230, 231, 232, 286, 527, 529, 545, 546, 919

[56] References Cited

U.S. PATENT DOCUMENTS

| | | | |
|---|---|---|---|
| 4,703,551 | 11/1987 | Szluk et al. ............................. | 438/220 |
| 5,110,750 | 5/1992 | Yoshida .................................. | 438/529 |
| 5,496,751 | 3/1996 | Wei et al. ............................... | 437/41 |
| 5,534,449 | 7/1996 | Dennison et al. ...................... | 437/34 |
| 5,595,919 | 1/1997 | Pan ........................................ | 437/29 |
| 5,650,340 | 7/1997 | Burr et al. .............................. | 437/30 |
| 5,851,866 | 12/1998 | Son ........................................ | 438/231 |
| 5,946,564 | 8/1999 | Wu et al. ................................ | 438/527 |

*Primary Examiner*—Chandra Chaudhari
*Attorney, Agent, or Firm*—George O. Saile; Stephen B. Ackerman; Graham S. Jones, II

[57] ABSTRACT

A semiconductor device is formed on a semiconductor substrate with an N-well and a P-well with source/drain sites in the N-well and in the P-well by the following steps. Form a gate oxide layer and a gate electrode layer patterned into a gate electrode stack with sidewalls over a substrate with N-well and P-well. Form N− LDS/LDD regions in the P-well. Form N− LDS/LDD regions in the P-well and P− lightly doped halo regions in the P-well below the source site and the drain site in the P-well. Form a counter doped halo region doped with N type dopant below the source region site in the P-well. Form spacers on the gate electrode sidewalls. Then, form lightly doped regions self-aligned with the gate electrode in the source/drain sites. Form N+ type doped source/drain regions deeper than the N− LDS/LDD regions in the P-well in the source/drain sites. Form P+ type doped source/drain regions deeper than the P− LDS/LDD regions in the N-well in the source/drain sites.

9 Claims, 6 Drawing Sheets

DRAIN AND SOURCE ENGINEERING FOR
ESD-PROTECTION TRANSISTORS

BACKGROUND OF THE INVENTION

1. Field of the Invention

This invention relates to CMOS FET semiconductor memory and logic devices with enhanced ESD (ElectroStatic Discharge) performance and more particularly to the source and drain regions structures therein and methods of manufacture thereof.

2. Description of Related Art

1. The reduced drain doping concentration in deep submicron transistors reduces substrate current, and delays the snapback effect.

2. An ESD deep-drain-implant cannot be used due to significant punchthrough effect between source and drain.

U.S. Pat. No. 5,595,919 of Pan for "Method for Making Self-Aligned Halo Process for Reducing Junction Capacitance" describes an LDD structure made using a self-aligned halo process.

U.S. Pat. No. 5,496,751 of Wei et al. for "Method of Forming an ESD and Hot Carrier Resistant Integrated Circuit Structure" describes a method of forming an ESD circuit having LDD regions (preferably formed by LATID) and DDD regions. Among other things, this reference differs from the counter Halo/drain halo regions of the present invention.

U.S. Pat. No. 5,650,340 of Burr et al. for "Method of Making Asymmetric Low Power MOS Devices" teaches a low threshold voltage MOS devices having asymmetric halo implants. An asymmetric halo implant provides a pocket region (P+) located under the source region or under the drain region of a device.

U.S. Pat. No. 5,534,449 of Dennison et al. for "Methods of Forming Complementary Metal Oxide Semiconductor CMOS Integrated Circuitry" describes a method of forming CMOS integrated circuitry having four doped regions comprising the source/drain regions.

A problem with the prior art in view of trends to greater degrees of miniaturization is that junction leakage and junction short circuits to the substrate are more and more likely to occur in advanced technology devices as the dimensions of the devices forming those circuits become smaller and smaller.

SUMMARY OF THE INVENTION

An object of this invention is to reduce drain breakdown voltage to increase substrate current, without degrading punchthrough effect.

An object of this invention is to reduce the snapback $V_{be}$ at source junction.

A key feature of this invention is a counter doped halo region for the source region with drain halo regions in an ESD transistor.

In accordance with this invention, a method of forming a semiconductor memory device formed on a semiconductor substrate with an N-well and a P-well with source/drain sites in the N-well and in the P-well comprises the following steps. Form a gate oxide layer and a gate electrode layer patterned into a gate electrode over a substrate with N-well and P-well. Form N– LDS and LDD regions in the P-well. Form P– LDS /LDD regions in the N-well and P– lightly doped halo regions in the P-well below the source site N-LDS and the drain site N-LDD in the P-well. Form a counter doped halo region doped with N type dopant below the source region site in the N-well. Form spacers on the gate electrode sidewalls. Thereafter form lightly doped regions self-aligned with the gate electrode in the source/drain sites. Form N+ type doped source/drain regions deeper than the N– LDS /LDD regions in the P-well in the source/drain sites. Form P+ type doped source/drain regions deeper than the P– LDS /LDD regions in the N-well in the source/drain sites.

Preferably, the counter doped N type halo region is formed to a depth from about 400 Å to about 2,500 Å below the surface of the substrate. The counter doped N type halo region is formed to a depth from about 400 Å to about 2,500 Å below the surface of the substrate.

LDD/LDS regions are formed in the P-well by ion implanting with a dose of phosphorus or arsenic dopant ions from about 1 E 13 ions/cm$^2$ to about 5 E 14 ions/cm$^2$ at an energy from about 30 keV to about 80 keV.

P type dopant is ion implanted into the P-well on the side of the gate below the N– lightly doped region and ion implanting ions of P type dopant into the N-well comprising boron or boron difluoride ($BF_2$) are ion implanted into LDS/LDD regions in the N-well with a dose from about 1 E 13 ions/cm$^2$ to about 5 E 14 ions/cm$^2$ at an energy from about 15 keV to about 50 keV. An N– halo region below the source region is formed in the P-well by ion implanting with a dose of phosphorus or arsenic dopant ions from about 1 E 12 ions/cm$^2$ to about 1 E 14 ions/cm$^2$ at an energy from about 20 keV to about 80 keV. A P– lightly doped halo region is formed in the P-well below the source site concomitantly with forming the halo region below the drain site.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

FIGS. 1A–1E illustrate a sequence of steps in accordance with this invention for manufacturing a first embodiment of a memory and logic device 10 in accordance with this invention. In FIG. 2, the steps of the process for forming the device 10 of FIGS. 1A–1E are described. Referring to FIG. 2, the process starts in step 40 with the P– doped silicon semiconductor substrate 12.

Figure 1A:
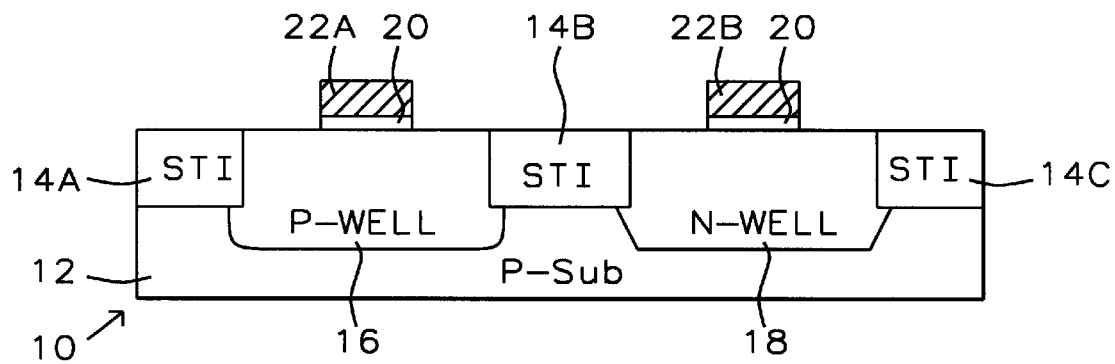
FIGS. 1A–1E illustrate a sequence of steps in accordance with this invention for manufacturing a first embodiment of a memory or logic CMOS device in accordance with this invention.
Figure 2:
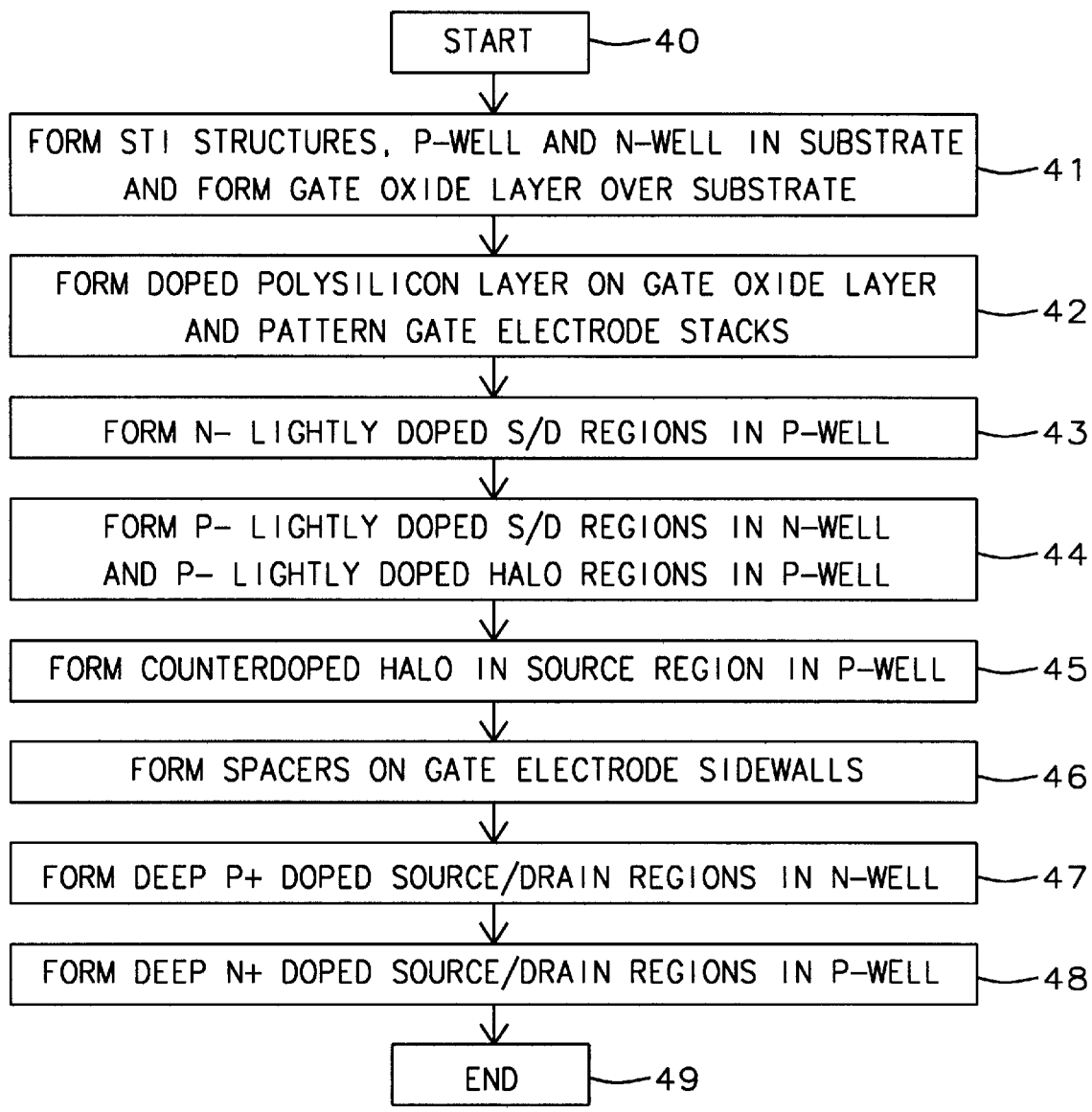
FIG. 2 shows a flow chart of process steps for forming the device of FIGS. 1A–1E.

FIG. 1A shows a CMOS FET device 10 with P– doped substrate 12 with a set of shallow trench isolation (STI) regions 14A–14C which have been formed in the surface thereof.

In step 41, form conventional STI trench structures 14A, 14B and 14C in the substrate 12 and then back fill with silicon oxide dielectric in the conventional manner. A form a P-well 16 in substrate 12 between STI structures 14A and 14B; and form an N-well 18 in substrate 12 between STI structures 14B and 14C.

In step 42, form a gate oxide layer 20 is formed on substrate 12 covering the surfaces of N-well 16 and P-well 18. Then cover the gate oxide layer 20 with a doped polysilicon layer, which has been patterned along with gate oxide layer 20 into gate electrode stacks including gate electrodes 22A and 22B and gate oxide layer 20 therebelow.

Figure 1B:
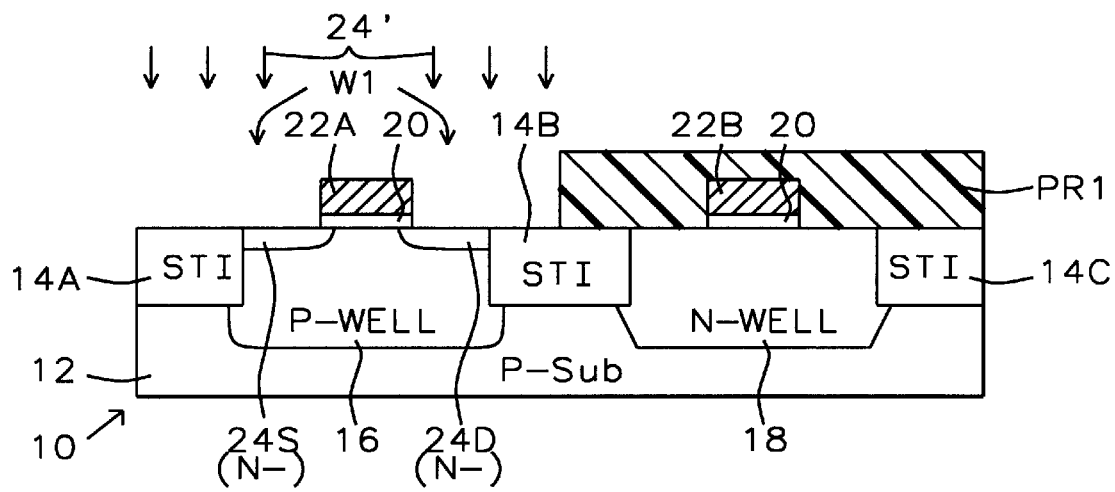

In step 43, as shown in FIG. 1B, form a mask PR1 with a window W1 over P-well 16. Then ion implant N− dopant to form N− lightly doped source (LDS) region 24S and lightly doped drain (LDD) region 24D in P-well 16 self-aligned with the gate electrode 22A.

The lightly doped (LDS/LDD) N− source region 24S and drain region 24D are formed by ion implanting with a dose of phosphorus or arsenic dopant ions 24' from about $1 E 13$ ions/cm$^2$ to about $5 E 14$ ions/cm$^2$ at an energy from about 30 keV to about 80 keV. After annealing the concentration of phosphorus or arsenic dopant in the LDS/LDD regions 24S/24D was from about $5 E 16$ atoms/cm$^3$ to about $1 E 19$ atoms/cm$^3$.

Figure 1C:
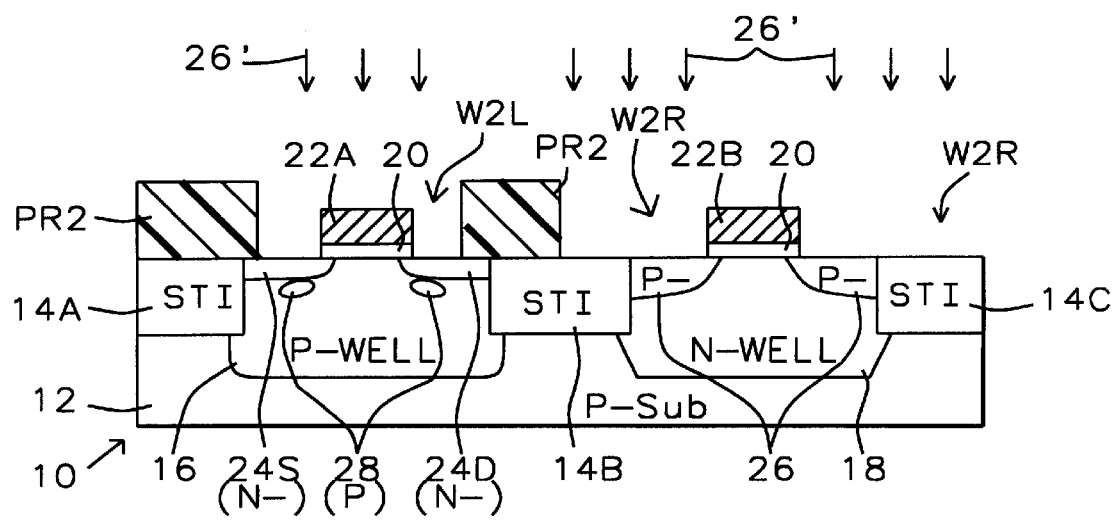

In step 44, as shown in FIG. 1C, form a mask PR2 with windows W2L and W2R over P-well 16 and N-well 18. Window 2L is narrow and centers over the gate electrode stack 22A/20. The window W2R is used to form P− lightly doped source and lightly doped drain regions 26 in N-well 18 self-aligned with the gate electrode 22B by ion implanting ions 26' into the N-well 18.

The window W2L is used to form halo implants of P type dopant into the P-well 16 on either side of the gate electrode stack 22A/20 below the N− LDS region 24S and LDD region 24 in P-well 16. The window W2L is used to form P type halo implants into P-well 16 self-aligned with the gate electrode 22A by ion implanting ions 26' into the N-well.

The ions 26', comprising boron or boron difluoride (BF$_2$), are ion implanted into LDS/LDD regions 26S/26D with a dose from about $1 E 13$ ions/cm$^2$ to about $5 E 14$ ions/cm$^2$ at an energy from about 15 keV to about 50 keV. After annealing the concentration of boron dopant in the regions 26S/26D and halo regions 28 was from about $5 E 16$ atoms/cm$^3$ to about $1 E 19$ atoms/cm$^3$. In the P-well 16, the N− LDD/LDS regions 24D/24S overcompensate the P type halo region 28 dopant. Thus, the halo regions 28 in the P-well 16 are formed as separate features below the N− LDS/LDD regions 24S/24D.

Figure 1D:
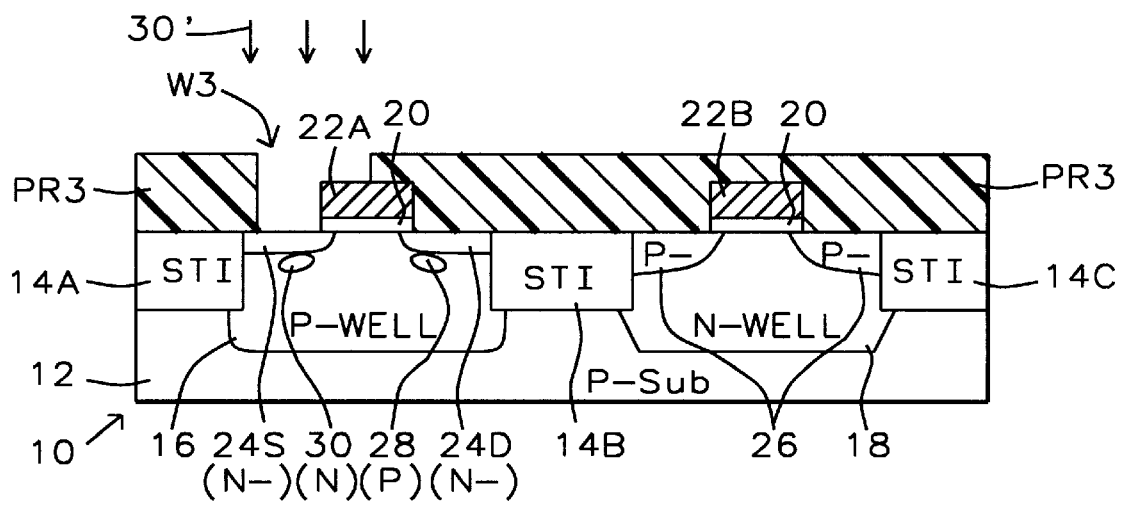
Figure 1E:
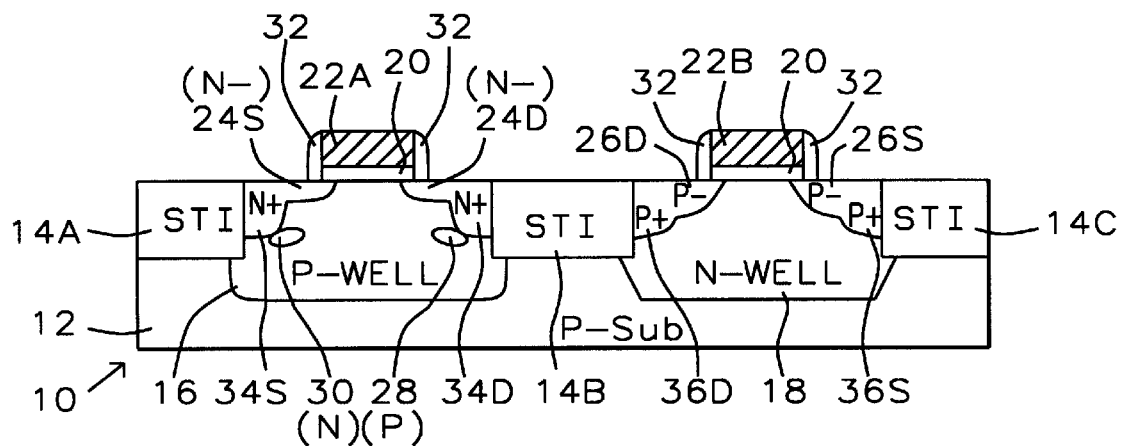

In step 45, as shown in FIG. 1D, form a mask PR3 with a window W3 over the source region in P-well 16. Window W3 is narrow and window W3 is centered over the left side of gate electrode stack 22A/20 to form a counter doped N type halo implant 30 of N type dopant into the P-well 16 on the left side of the gate electrode stack 22A/20 below the N− lightly doped source (LDS) region 24S in P-well 16. This is superimposed on the halo implant 28 formed in the previous step 44 as shown in FIG. 1C.

The N− halo region 30 is formed by ion implanting with a dose of phosphorus or arsenic dopant ions 30' from about $1 E 12$ ions/cm$^2$ to about $1 E 14$ ions/cm$^2$ at an energy from about 20 keV to about 80 keV. After annealing the N− dopant concentration of phosphorus or arsenic dopant in the counter doped halo region 30 was from about $1 E 16$ atoms/cm$^3$ to about $5 E 18$ atoms/cm$^3$. The concentration of the counter doped N− halo 30 is higher than the previously implanted P− halo 28. The N− halo 30 compensates the P− halo 28, reducing the net concentration of the P-well 16 in the counter doped region 31.

In step 46, form conventional silicon oxide, dielectric spacers 32 on sidewalls of gate electrode stacks 22A/20 and 22B/20.

In step 47, form deep P+ doped source/drain (S/D) regions 36 in N-well 18, self-aligned with gate electrode 22B. The P+ regions 36 extend below the P− lightly doped regions 26.

The P+ regions 36 were ion implanted with a dose of boron dopant in a range from about $1 E 14$ ions/cm$^2$ to about $1 E 16$ ions/cm$^2$ at an energy from about 80 keV to about 10 keV. After annealing, the concentration of boron dopant in the regions 36 was from about $5 E 18$ atoms/cm$^3$ to about $5 E 20$ atoms/cm$^3$.

In step 48, form deep N+ doped source/drain regions 34 in P-well 16, self-aligned with gate electrode 22A. The N+ regions 34 extend below the P− lightly doped regions 26.

The N+ regions 34 were ion implanted with a dose of phosphorus or arsenic dopant from about $1 E 14$ ions/cm$^2$ to about $1 E 16$ ions/cm$^2$ at an energy from about 10 keV to about 80 keV. After annealing, the concentration of phosphorus or arsenic dopant in the regions 36 was from about $5 E 18$ atoms/cm$^3$ to about $5 E 20$ atoms/cm$^3$.

In step 49, the process of FIG. 1 ends.

FIGS. 3A–3E illustrate a sequence of steps in accordance with this invention for manufacturing a second embodiment of a memory or logic device 10' in accordance with this invention. In FIG. 4, the steps of the process for forming the device 10' of FIGS. 3A–3E are described. The process starts in step 50 of FIG. 4 with the P− doped silicon semiconductor substrate 12.

Figure 3A:
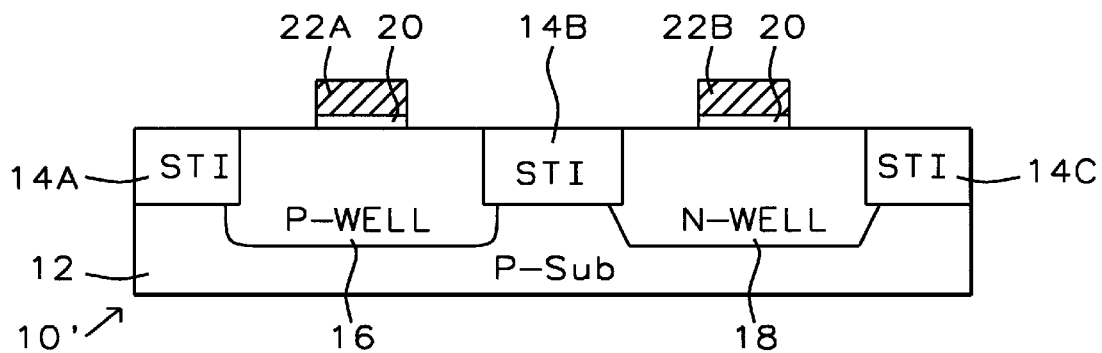
FIGS. 3A–3E illustrate a sequence of steps in accordance with this invention for manufacturing a second embodiment of a memory device in accordance with this invention.
Figure 4:
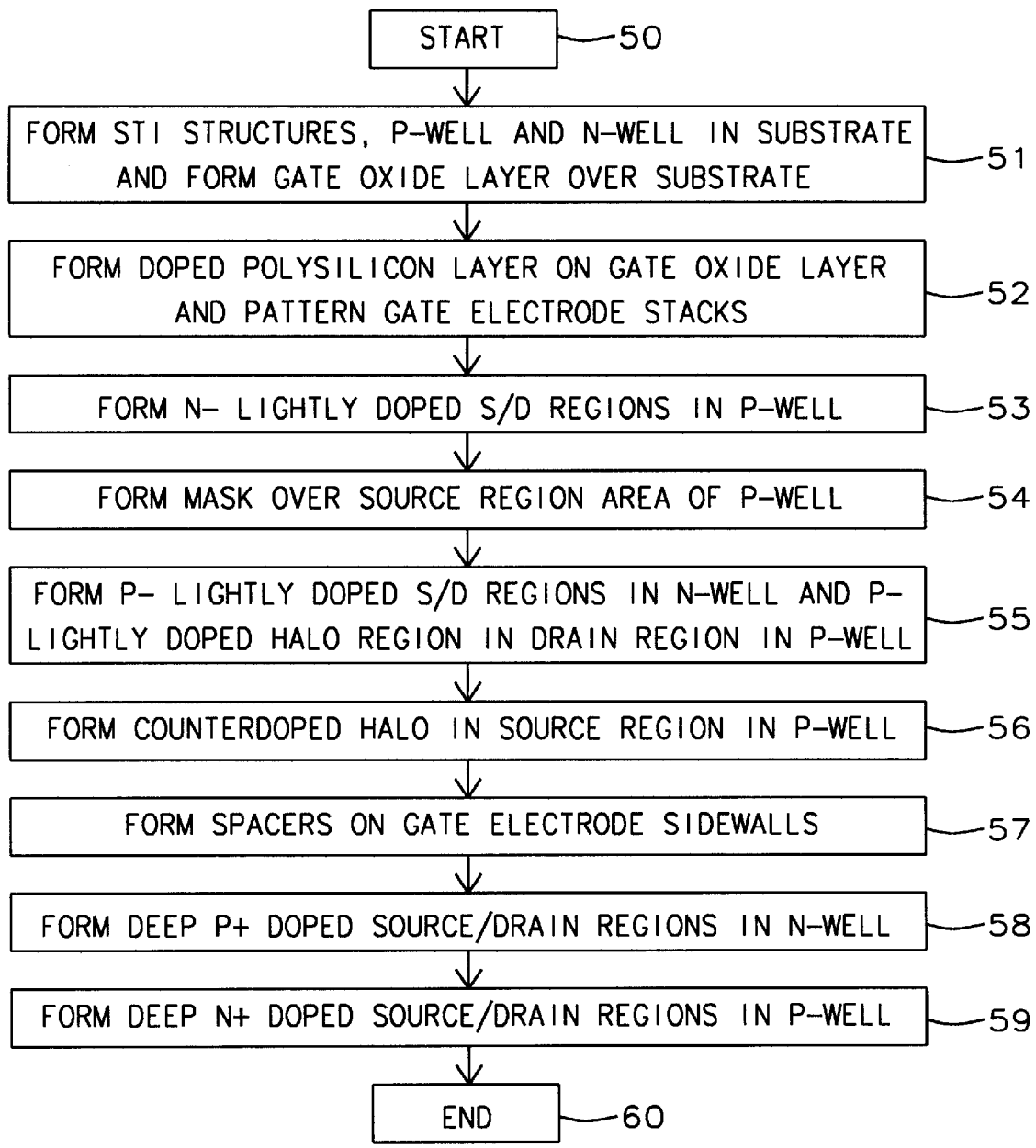
FIG. 4 shows a flow chart of process steps for forming the device of FIGS. 3A–3E.

FIG. 3A shows a CMOS FET device 10' with P− doped substrate 12 with a set of shallow trench isolation (STI) regions 14A–14C which have been formed in the surface thereof.

In step 51, form conventional STI trench structures 14A, 14B and 14C in the substrate 12 and then back filled with silicon oxide dielectric in the conventional manner. A P-well 16 is formed in substrate 12 between STI structures 14A and 14B; and an N-well 18 is formed in substrate 12 between STI structures 14B and 14C.

In step 51, a gate oxide layer 20 is formed on substrate 12 covering the surfaces of N-well 16 and P-well 18. Then, in step 52, cover gate oxide layer 20 with a doped polysilicon layer, and pattern the doped polysilicon layer gate oxide layer 20 into gate electrode stacks including gate electrodes 22A and 22B and gate oxide layer 20 therebelow.

Figure 3B:
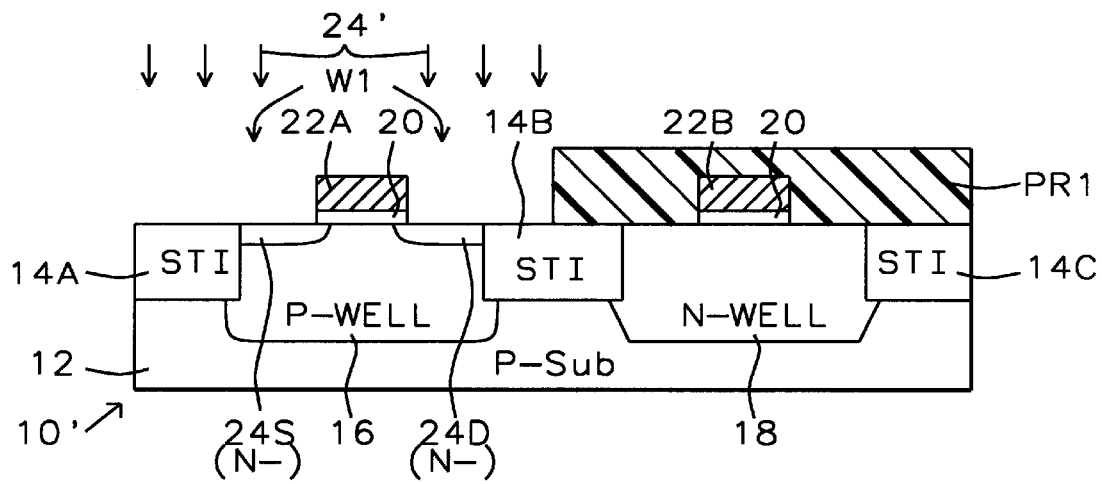

In step 53, as shown in FIG. 3B, form a mask PR1 with a window W1 over P-well 16. Then ion implant N− dopant to form N− lightly doped source and lightly doped drain regions 24 in P-well 16 self-aligned with the gate electrode 22A.

The lightly doped N− regions 24 are ion implanted with a dose of phosphorus or arsenic dopant ions 24' from about $1 E 13$ ions/cm$^2$ to about $5 E 14$ ions/cm$^2$ at an energy from about 30 keV to about 80 keV. After annealing the concentration of phosphorus or arsenic dopant in the regions 24 was from about $5 E 16$ atoms/cm$^3$ to about $1 E 19$ atoms/cm$^3$.

Figure 3C:
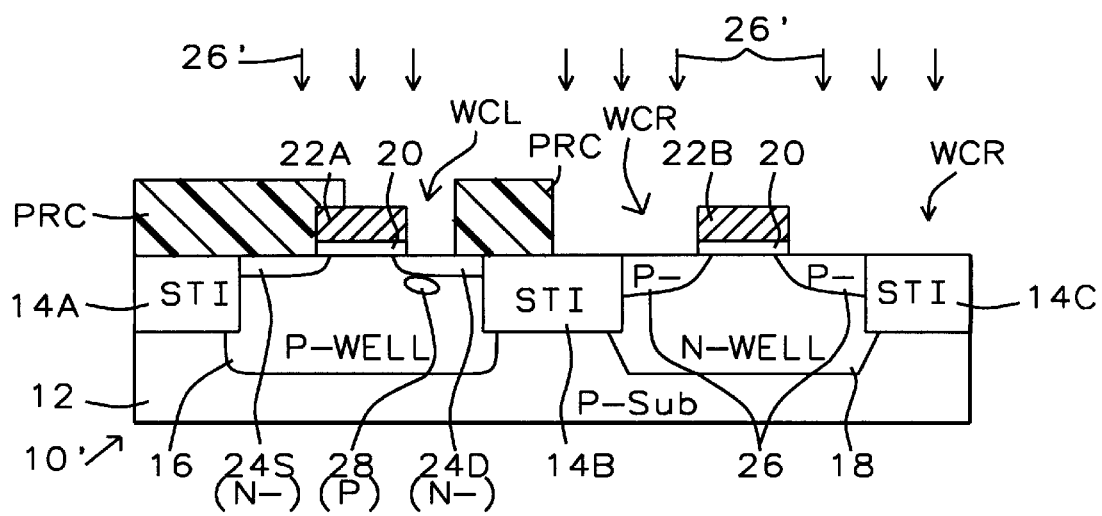

In step 54, as shown in FIG. 3C, form a mask PRC with windows WCL and WCR over P-well 16 and N-well 18. Window WCL is narrow and centers over the right side of gate electrode stack 22A/20. In step 55, the window WCR is used to form, in N-well 18, the P− lightly doped source and lightly doped drain regions 26 self-aligned with the gate electrode 22B by ion implanting ions 26' into the N-well 18.

The window WCL is used to form a halo implant of P type dopant ions 26' into the P-well 16 on the right side of the gate electrode stack 22A/20 below the N− lightly doped drain region 24 in P-well 16. The window W2L is used to form the P type halo implant 28 into P-well 16 self-aligned with the gate electrode 22A by ion implanting ions 26' into the N-well 18.

The P type ions 26', comprising boron or boron difluoride (BF$_2$), are ion implanted with a dose of from about 1 E 13 ions/cm$^2$ to about 5 E 14 ions/cm$^2$ at an energy from about 15 keV to about 50 keV. After annealing the concentration of boron dopant in the regions 26 and halo regions 28 was in a range from about 5 E 16 atoms/cm$^3$ to about 1 E 19 atoms/cm$^3$. In the P-well 16, the N− drain region 24D overcompensates. Thus, the halos in the P-well 16 are formed as separate features below the N− regions 24.

Figure 3D:
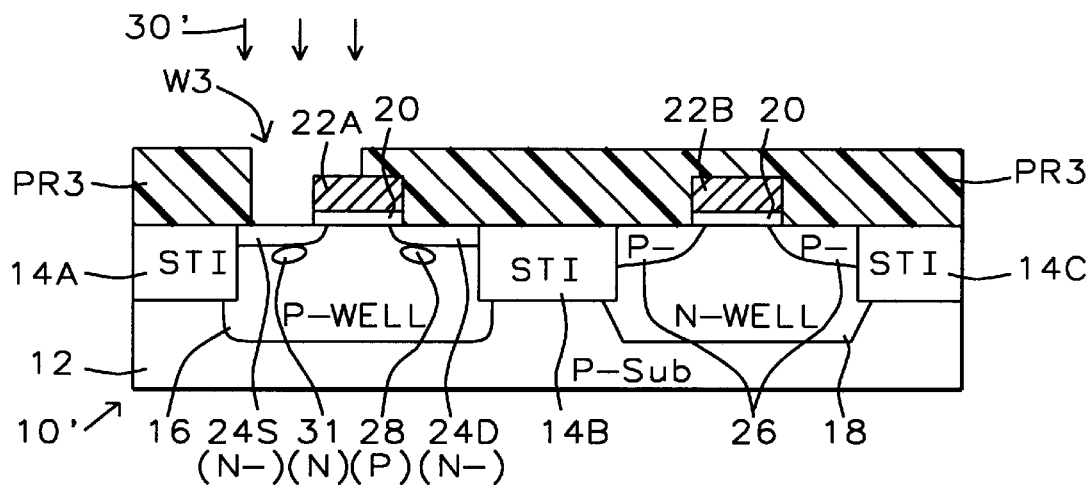
Figure 3E:
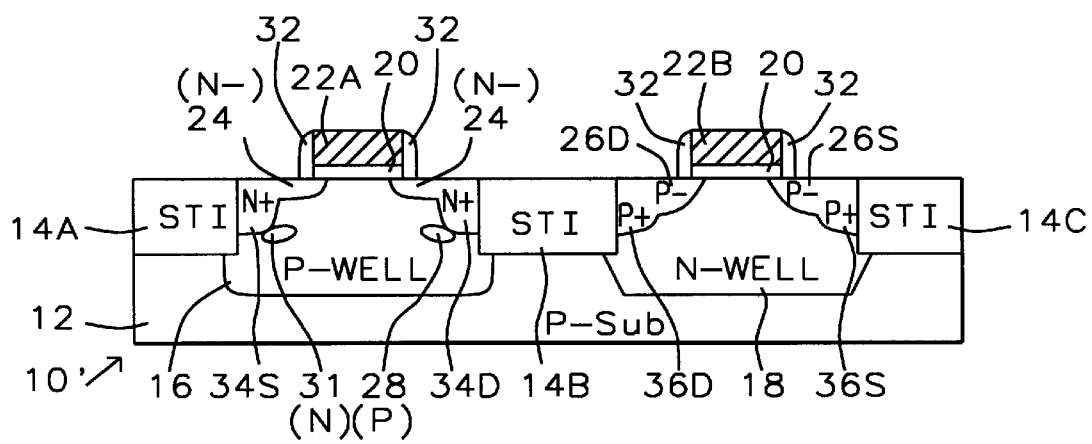

In step 56, as shown in FIG. 3D, form a mask PR3 with a window W3 over the source region in P-well 16. The window W3 is narrow and window W3 is centered over the left side of gate electrode stack 22A/20 to form a counter doped halo implant 31 of N type dopant into the P-well 16 on the left side of the gate electrode stack 22A/20 below the N− lightly doped source region 24 in P-well 16.

The N− halo region 30 is formed by ion implanting with a dose of phosphorus or arsenic dopant ions 30' from about 1 E 12 ions/cm$^2$ to about 1 E 14 ions/cm$^2$ at an energy from about 20 keV to about 80 keV. After annealing the concentration of phosphorus or arsenic dopant in the counter doped halo region 30 was in a range from about 1 E 16 atoms/cm$^3$ to about 5 E 18 atoms/cm$^3$. The N− halo 30 compensates the dopant in the P-well 16. The net doping concentration in the N− halo 31 is less than the concentration of the P-well 16 and is still P-type.

In step 57, form conventional silicon oxide, dielectric spacers 32 on sidewalls of gate electrode stacks 22A/20 and 22B/20.

In step 58, form deep P+ doped source/drain regions 36S/36D in N-well 18, self-aligned with gate electrode 22B. The P+ regions 36S/36D extend below the P− lightly doped regions 26.

The P+ regions 36S/36D were ion implanted with a dose of boron dopant in a range from about 1 E 14 ions/cm$^2$ to about 1 E 16 ions/cm$^2$ at an energy from about 10 keV to about 80 keV. After annealing, the concentration of boron dopant in the regions 36S/36D was in a range from about 5 E 18 atoms/cm$^3$ to about 5 E 20 atoms/cm$^3$.

In step 59, form deep N+ doped source/drain regions 34S/34D in P-well 16, self-aligned with gate electrode 22A. The N+ regions 34 extend below the P− lightly doped regions 26.

The N+ regions 34S/34D were ion implanted with a dose of phosphorus or arsenic dopant from about 1 E 14 ions/cm$^2$ to about 1 E 16 ions/cm$^2$ at an energy from about 10 keV to about 80 keV. After annealing, the concentration of phosphorus or arsenic dopant in the regions 36 was from about 5 E 18 atoms/cm$^3$ to about 5 E 20 atoms/cm$^3$.

In step 60, the process of FIG. 3 ends.

SUMMARY OF FEATURES OF THIS INVENTION

1. The substrate current at the drain is increased by drain-HALO doping independent of a source.

2. The snapback effect is initiated by a source-side counter HALO implant, independently of the drain region. The reduced P-type net doping concentration (which is equivalent to reducing the base doping concentration in a PNP Bipolar Junction Transistor (BJT)) gives higher common emitter current gain, of the parasitic BJT, allowing earlier BJT turn on and a snapback effect.

3. Fabrication sequences of making transistors with drain Halo and source counter Halo in an ESD protection device are provided.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a semiconductor device selected from memory and logic devices on a semiconductor substrate with an N-well and a P-well with P+ source/drain region sites in said N-well and N+ source/drain region sites in said P-well comprising the steps as follows:

form a gate oxide layer and a gate electrode layer patterned into a gate electrode stack with sidewalls over a substrate with an N-well with N type dopant and a P-well with P type dopant, form an N− lightly doped source (LDS) region at said source region site and an N− lightly doped drain (LDD) region at said drain region site in said P-well, form a P− LDS region and a P− LDD region in said N-well while forming a P− lightly doped halo region in said P-well below said N+ drain region site, form a counter doped halo region doped with N type dopant below said N+ source region site in said P-well to compensate P-type dopant previously formed by a source of dopant selected from the group comprising a P-halo dopant and said P-well dopant, where said counter doped halo region is formed, form spacers on said gate electrode sidewalls, thereafter form lightly doped regions self-aligned with said gate electrode in said source/drain region sites, form N+ type doped source/drain regions deeper than said N− LDS/LDD regions in said P-well in said N+ source/drain region sites, and form P+ type doped source/drain regions deeper than said P− LDS/LDD regions in said N-well in said P+ source/drain region sites.

2. A method in accordance with claim 1 including as follows:

forming said the counter doped N type halo region to a depth from about 400 Å to about 2,500 Å below the surface of the substrate.

3. A method in accordance with claim 1 including forming a P− lightly doped halo region in said P-well below said source region site concomitantly with forming said halo region below said drain region site.

4. A method in accordance with claim 1 including:

forming an N− LDS region and a LDD region in said P-well by ion implanting with a dose of phosphorus or arsenic dopant ions from about 1 E 13 ions/cm$^2$ to about 5 E 14 ions/cm$^2$ at an energy from about 30 keV to about 80 keV, ion implanting ions of P type dopant into the P-well on the side of the gate below the N− lightly doped region and ion implanting ions of P type dopant into said LDS/LDD regions in said N-well, said ions comprising boron or boron difluoride (BF$_2$) with a dose from about 1 E 13 ions/cm$^2$ to about 5 E 14 ions/cm$^2$ at an energy from about 15 keV to about 50 keV, and forming an N− halo region below the source region site in said P-well by ion implanting with a dose of phosphorus or arsenic dopant ions from about 1 E 12 ions/cm$^2$ to about 1 E 14 ions/cm$^2$ at an energy from about 20 keV to about 80 keV.

5. A method in accordance with claim 4 wherein a P− lightly doped halo region is formed in said P-well below said source region site concomitantly with forming said halo region below said drain region site.

6. A method of forming a semiconductor device selected from memory and logic devices on a semiconductor substrate with an N-well and a P-well with source/drain region sites in said N-well and in said P-well comprising the steps as follows:

form a gate oxide layer and a gate electrode layer patterned into a gate electrode stack with sidewalls over a substrate with an N-well with N type dopant and a P-well with P type dopant, form N− LDS and LDD regions in said P-well, form P− LDS and LDD regions in said N-well and P− lightly doped halo regions in said P-well below said source region site and said drain region site in said P-well, form a counter doped halo region doped with N type dopant below said source region site in said P-well to compensate P-type dopant previously formed by a source of dopant selected from the group comprising a P-halo dopant and said P-well dopant where said counter doped halo region is formed, form spacers on said gate electrode sidewalls, form N+ type doped source/drain regions deeper than said N− LDS/LDD regions in said P-well in said source/drain region sites, and form P+ type doped source/drain regions deeper than said P− LDS/LDD regions in said N-well in said source/drain region sites.

7. A method in accordance with claim 6 including forming said counter doped N type halo region to a depth from about 400 Å to about 2,500 Å below the surface of the substrate.

8. A method in accordance with claim 6 including:

forming a lightly doped N− source (LDS) N− region and a lightly doped drain (LDD) N− region in said P-well by ion implanting with a dose of phosphorus or arsenic dopant ions from about 1 E 13 ions/cm$^2$ to about 5 E 14 ions/cm$^2$ at an energy from about 30 keV to about 80 keV, ion implanting ions of P type dopant into the P-well on the side of the gate below the N− lightly doped region and ion implanting ions of P type dopant into the N-well comprising boron or boron difluoride (BF$_2$), are ion implanted into LDS/LDD regions in said N-well with a dose from about 1 E 13 ions/cm$^2$ to about 5 E 14 ions/cm$^2$ at an energy from about 15 keV to about 50 keV, forming an N− halo region below the source region in said P-well by ion implanting with a dose of phosphorus or arsenic dopant ions from about 1 E 12 ions/cm$^2$ to about 1 E 14 ions/cm$^2$ at an energy from about 20 keV to about 80 keV.

9. A method in accordance with claim 8 including forming a P− lightly doped halo region in said P-well below said source region site concomitantly with forming said halo region below said drain region site.

* * * * *